United States Patent
Larsen et al.

(10) Patent No.: US 9,679,964 B2
(45) Date of Patent: Jun. 13, 2017

(54) SEMICONDUCTOR CONSTRUCTIONS HAVING PERIPHERAL REGIONS WITH SPACED APART MESAS

(71) Applicant: Micron Technology, Inc., Boise, ID (US)

(72) Inventors: Chris Larsen, Boise, ID (US); Alex J. Schrinsky, Boise, ID (US); John D. Hopkins, Meridian, ID (US); Matthew J. King, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 13 days.

(21) Appl. No.: 14/853,793

(22) Filed: Sep. 14, 2015

(65) Prior Publication Data

US 2016/0005815 A1    Jan. 7, 2016

Related U.S. Application Data

(63) Continuation of application No. 13/860,427, filed on Apr. 10, 2013, now Pat. No. 9,136,331.

(51) Int. Cl.
| | |
|---|---|
| H01L 21/76 | (2006.01) |
| H01L 29/06 | (2006.01) |
| H01L 29/66 | (2006.01) |
| H01L 21/762 | (2006.01) |
| H01L 21/74 | (2006.01) |

(52) U.S. Cl.
CPC .... *H01L 29/0657* (2013.01); *H01L 21/76224* (2013.01); *H01L 29/0649* (2013.01); *H01L 29/0692* (2013.01); *H01L 21/743* (2013.01)

(58) Field of Classification Search
CPC ........... H01L 29/0657; H01L 21/76232; H01L 21/764; H01L 29/0661; H01L 29/6609
USPC ................ 257/296–302, 506–516, 314–315, 257/523–524, 527, 566
See application file for complete search history.

(56) References Cited

U.S. PATENT DOCUMENTS

| | | | |
|---|---|---|---|
| 5,049,518 A | 9/1991 | Fuse | |
| 6,287,935 B1 | 9/2001 | Coursey | |
| 6,657,248 B1 * | 12/2003 | Matsuzaki | ............ H01L 27/105 257/306 |
| 6,674,134 B2 * | 1/2004 | Berry | ................ H01L 21/76224 257/396 |
| 2003/0085443 A1 | 5/2003 | Kamiya | |
| 2004/0082140 A1 | 4/2004 | Yang et al. | |
| 2005/0056873 A1 | 3/2005 | Sommer et al. | |
| 2006/0258163 A1 | 11/2006 | Ohashi et al. | |

(Continued)

*Primary Examiner* — John C Ingham
*Assistant Examiner* — Didarul Mazumder
(74) *Attorney, Agent, or Firm* — Wells St. John P.S.

(57) ABSTRACT

Some embodiments include semiconductor constructions having semiconductor material patterned into two mesas spaced from one another by at least one dummy projection. The dummy projection has a width along a cross-section of X and the mesas have widths along the cross-section of at least 3X. Some embodiments include semiconductor constructions having a memory array region and a peripheral region adjacent the memory array region. Semiconductor material within the peripheral region is patterned into two relatively wide mesas spaced from one another by at least one relatively narrow projection. The relatively narrow projection has a width along a cross-section of X and the relatively wide mesas have widths along the cross-section of at least 3X.

19 Claims, 5 Drawing Sheets

(56) References Cited

U.S. PATENT DOCUMENTS

| | | |
|---|---|---|
| 2013/0052786 A1 | 2/2013 | Lee et al. |
| 2013/0207227 A1 | 8/2013 | Azam et al. |
| 2013/0291890 A1 | 11/2013 | Yoshida |
| 2013/0330907 A1* | 12/2013 | Lutz ................ H01L 21/76283 |
| | | 438/424 |

* cited by examiner

SEMICONDUCTOR CONSTRUCTIONS HAVING PERIPHERAL REGIONS WITH SPACED APART MESAS

RELATED PATENT DATA

This patent resulted from a continuation of U.S. patent application Ser. No. 13/860,427 filed Apr. 10, 2013, now U.S. Pat. No. 9,136,331, which is hereby incorporated by reference.

TECHNICAL FIELD

Semiconductor constructions.

BACKGROUND

Problems may be encountered during fabrication of semiconductor constructions when large mesas of semiconductor material are spaced from one another by regions of intervening material, as described with reference to FIGS. 1 and 2.

Figure 1:
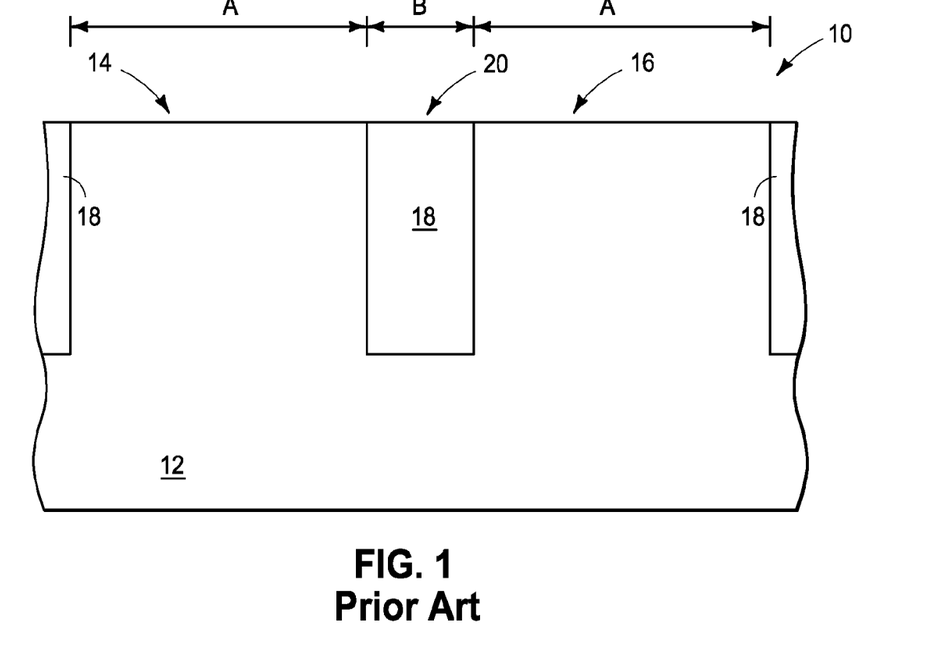
FIGS. 1 and 2 are diagrammatic cross-sectional views of a fragment of a semiconductor construction at prior art processing stages.

FIG. 1 shows a semiconductor construction 10 comprising a semiconductor material 12 patterned into a pair of mesas 14 and 16. The semiconductor material may comprise, for example, silicon. The mesas 14 and 16 are spaced from one another by an intervening region 20.

Intervening material 18 is adjacent the mesas and between the mesas. Such intervening material may comprise, for example, silicon dioxide. The intervening material 18 fills the intervening region 20.

The mesas 14 and 16 have widths along the cross-section of FIG. 1 of "A" and the intervening region 20 has a width along such cross-section of "B". The dimension "A" is much larger than the dimension "B". In some applications, "A" may be at least about 400 nanometers (nm), and "B" may be less than or equal to about 250 nm.

The intervening material 18 has stresses associated therewith, and such stresses can induce defects within the semiconductor material of mesas 14 and 16. For instance, FIG. 2 shows construction 10 after thermal processing and diagrammatically illustrates propagation of dislocations (indicated by dashed lines 19) within the semiconductor material 12 of mesas 14 and 16. Such dislocations may occur, for example, during crystallization of semiconductor material 12 in a thermal anneal.

In some applications integrated circuitry extends into the semiconductor material of mesas 14 and 16. The defects induced within the mesas may reduce reliability of such circuitry, or may even render the circuitry inoperable. Accordingly, it is desired to develop architectures which alleviate defect formation within the semiconductor material of mesas 14 and 16.

DETAILED DESCRIPTION OF THE ILLUSTRATED EMBODIMENTS

In some embodiments, semiconductor material projections (for instance, pillars) are provided within intervening regions between semiconductor material mesas prior to formation of intervening materials within such intervening regions. The semiconductor material projections alter the configuration of the intervening material relative to the prior art configurations described above with reference to FIGS. 1 and 2, and can alleviate or prevent the problematic defect formation described above in the "Background" section.

Example embodiments are described with reference to FIGS. 3-11.

Figure 3:
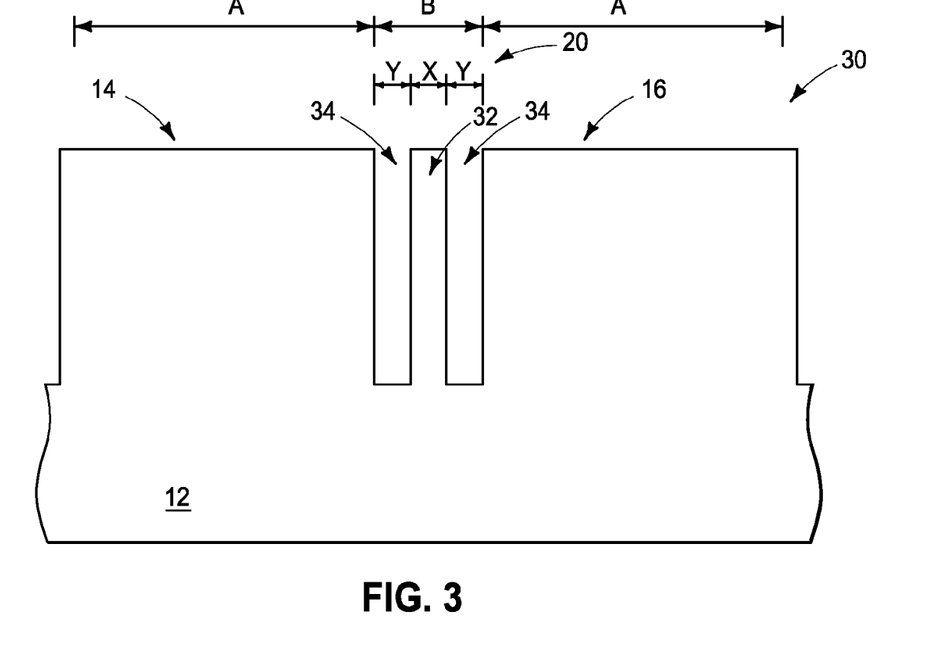
FIG. 3 is a diagrammatic cross-sectional view of a fragment of a semiconductor construction at a process stage of an example embodiment.

Referring to FIG. 3, a semiconductor construction 30 comprises a semiconductor material 12 patterned into mesas 14 and 16 analogous to those described above with reference to prior art FIG. 1, and such mesas are spaced from one another by an intervening region 20. The term "mesa" as utilized herein refers to a structure elevated above an adjacent topography; and the use herein is not intended to be rigorously analogous to the geologic definition unless such is expressly claimed. Thus, a "mesa" in accordance with the usage of the term herein may have steep walls and a relatively flat top analogous to land formations rigorously defined as mesas, or may have characteristics more analogous to other elevated land formations, such as hills, buttes, mountains, plateaus, etc.

The semiconductor material 12 may comprise any suitable semiconductor material; and in some embodiments may comprise, consist essentially of, or consist of silicon. The semiconductor material 12 may be considered to be part of a semiconductor base; and in some embodiments such base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. In some embodiments, the base may correspond to a semiconductor substrate containing one or more materials associated with integrated circuit fabrication. In such embodiments, such materials may correspond to one or more of refractory metal materials, barrier materials, diffusion materials, insulator materials, etc.

The semiconductor material 12 may be in any suitable phase, and in some embodiments may be monocrystalline, polycrystalline or amorphous. Also, the semiconductor material may comprise multiple phases. For instance, in some embodiments regions of the semiconductor material may be monocrystalline, while other regions are polycrystalline and/or amorphous. In some embodiments, the illustrated mesas of semiconductor material may comprise conductively-doped regions (not shown) and/or other integrated circuit constituents. In some embodiments, the illustrated mesas may comprise polycrystalline and/or amorphous silicon, and may be supported by an underlying monocrystalline silicon structure (for instance, a monocrystalline silicon wafer or chip).

The mesas 14 and 16 are shown to have widths along the cross-section of FIG. 3 of "A", and the intervening region 20 is shown to have a width along such cross-section of "B". The dimensions "A" and "B" may be analogous to those described above with reference to the prior art in some embodiments. Although the mesas 14 and 16 are shown having the same widths as one another, in other embodiments the mesas may have different widths relative to one another.

Figure 2:
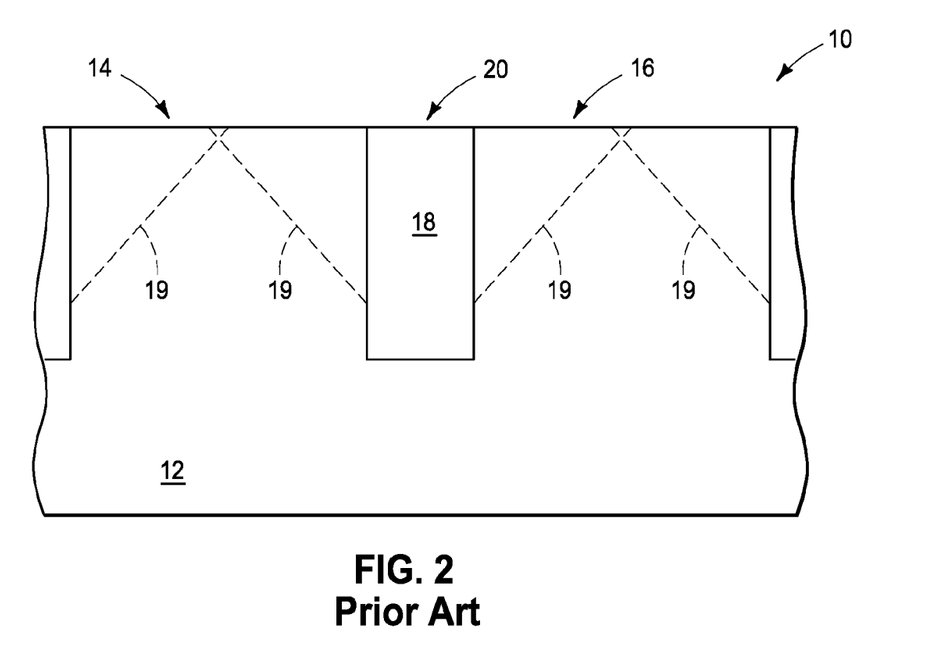

The construction 30 of FIG. 3 differs from the prior art construction of FIGS. 1 and 2 in that construction 30 comprises a projection (which may also be referred to as a pillar) 32 within the intervening region 20.

The projection 32 is narrower than the mesas 14 and 16. In some embodiments, the projection may be referred to as being "relatively narrow" as compared to the mesas which may be referred to as being "relatively wide". The illustrated projection 32 has a width "X" along the cross-section of FIG. 3. Such width "X" is much less than the widths "A" of the mesas 14 and 16. In some embodiments, "A" may be at least about 3X, at least about 5X, at least about 10X, at least about 100X, at least about 1000X, etc. For instance, in some embodiments "X" may be within a range of from about 10 nm to about 100 nm, and "A" may be at least about 1000 nm.

In some embodiments, the mesas 14 and 16 are formed with a photolithographic process. Such photolithographic process may have a minimum feature size "F" due to the wavelength of the photolithographic process and/or due to other processing limitations. The projection 32 may be formed with the same photolithographic process utilized to form the mesas 14 and 16, and may have a feature size approaching "F" while mesas 14 and 16 are formed to dimensions much larger than such feature size. In other embodiments, the projection 32 may be formed with processing (for instance, pitch-multiplication methodology) which enables projection 32 to be formed to sub-lithographic dimensions relative to the feature sizes achievable by the photolithographic processing utilized to form mesas 14 and 16. In such embodiments, the width "X" of projection 32 may be within a range of, for example, from about 10 nm to about 40 nm.

In the shown embodiment of FIG. 3, projection 32 is approximately centered within intervening region 20, and is spaced from mesas 14 and 16 by gaps 34 having widths of about "Y". In some embodiments, "Y" may be about the same as "X", and in other embodiments "Y" may be smaller than "X" or bigger than "X". Although the projection 32 is shown to be approximately centered within intervening region 20, in other embodiments the projection may be offset within the intervening region so that one of the gaps 34 is substantially larger than the other of the gaps 34.

The embodiment of FIG. 3 shows a single projection 32 formed within the intervening region 20. In other embodiments (for instance, embodiments described below with reference to FIGS. 6, 7 and 11) there may be two or more projections formed within an intervening region.

Figure 4:
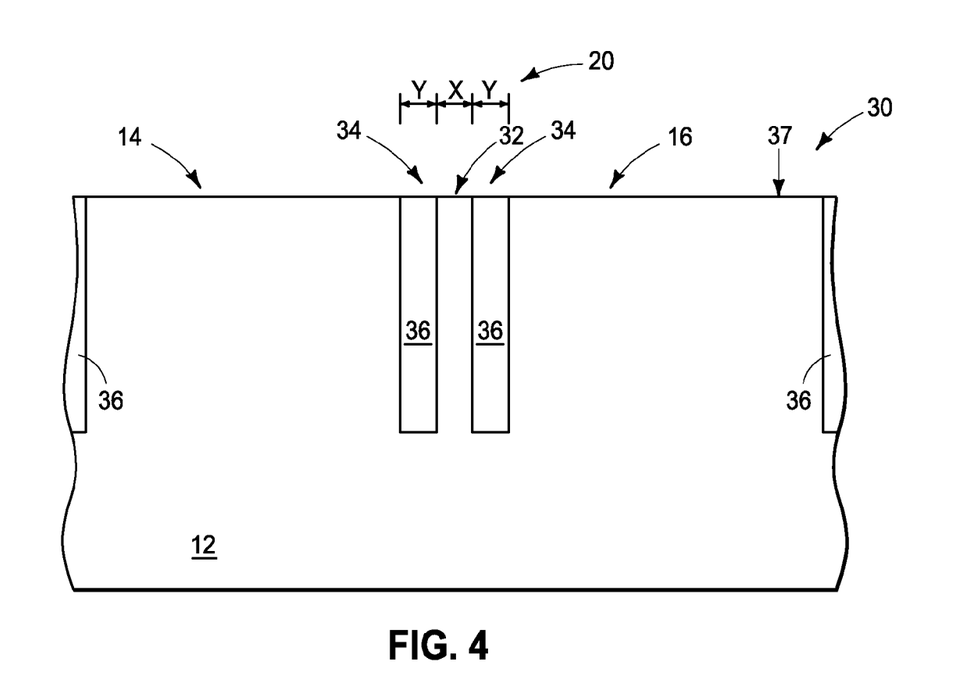
FIG. 4 is a view of the FIG. 3 fragment at a process stage subsequent to that of FIG. 3 in accordance with an example embodiment.

Referring to FIG. 4, intervening material 36 is formed within gaps 34. The intervening material may be deposited utilizing any suitable processing, including, for example, one or more of spin-on processing (e.g., the material 26 may be a spin-on dielectric), atomic layer deposition (ALD), chemical vapor deposition (CVD) and physical vapor deposition (PVD). In the shown embodiment, a planarized surface 37 extends across materials 12 and 36. Such planarized surface may be formed utilizing any suitable processing, including, for example, chemical-mechanical polishing (CMP). In some embodiments (not shown), the material 36 may be left across an upper surface of material 12 rather than being removed.

The material 36 may comprise any suitable composition or combination of compositions. In some embodiments, material 36 may be a dielectric material; and, for example, may comprise, consist essentially of, or consist of silicon dioxide, silicon nitride, etc. In some embodiments, material 36 may be a conductive material; and, for example, may comprise, consist essentially of, or consist of one or more of various metals (for instance, tungsten, titanium, platinum, etc.), and metal-containing compositions (for instance, metal carbides, metal silicides, etc.). If material 36 is dielectric material, such may be utilized for electrically isolating conductive structures within mesas 14 and 16 from one another. If material 36 is electrically conductive material, such may be utilized as wiring provided between mesas 14 and 16.

The material 36 within gaps 34 may be considered to be configured as structures between projection 32 and mesas 14 and 16. If material 36 is dielectric material, such structures may be considered to be electrically insulative structures. If material 36 is electrically conductive material, such structures may be considered to be electrically conductive structures. In the shown embodiment, the structures comprising material 36 have widths "Y" along the cross-section of FIG. 4 which are comparable to the width "X" of projection 32. In some embodiments, width "Y" may be within a range of from about 10 nm to about 100 nm; and in some embodiments width "Y" may be sub-lithographic and within a range of from about 10 nm to about 40 nm.

The projection 32 alters the configuration of intervening material 36 between mesas 14 and 16 as compared to the intervening material 18 of the prior art constructions of FIGS. 1 and 2. Such reduces stresses within intervening material 36 as compared to the stresses within intervening material 18 of the prior art constructions, and may alleviate or even prevent problems described above in the "Background" section. For instance, construction 30 may be subjected to a thermal anneal or other thermal treatment similar to that described above with reference to prior art FIG. 2 without propagation of the defects described above with reference to FIG. 2. In some embodiments, such thermal treatment may alter crystallinity within the semiconductor material of mesas 14 and 16 (for instance, may increase crystallinity within such mesas) without propagation of dislocations or the defects that problematically occur during analogous processing of prior art constructions.

Figure 5:
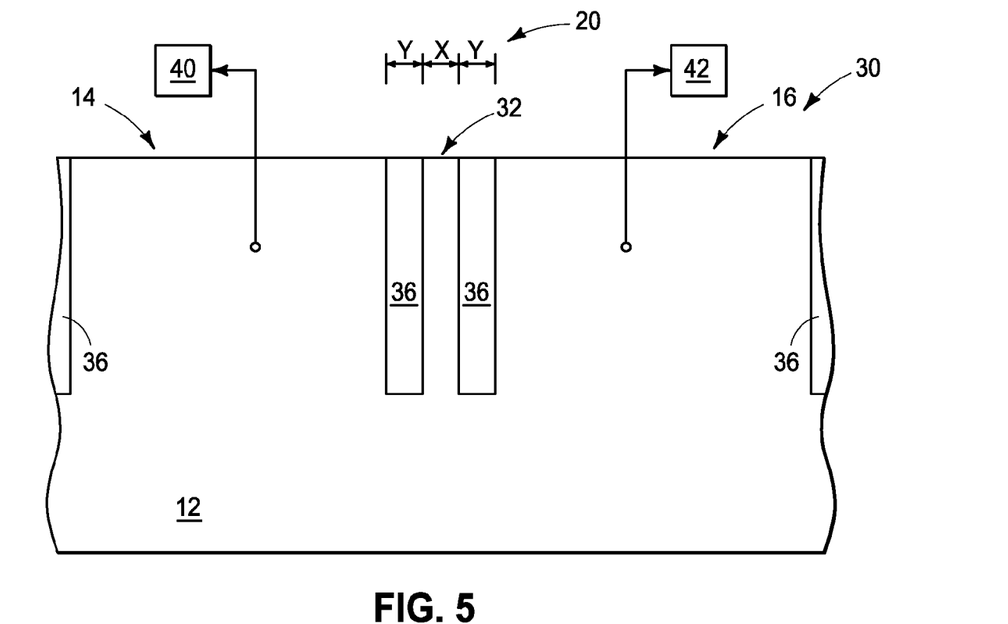
FIG. 5 shows the fragment of FIG. 4 incorporated into an example embodiment integrated circuit.

In some embodiments, projection 32 may have no electrical function, but instead may function only as a spacer provided within intervening region 20. In such embodiments, projection 32 may be referred to as a "dummy" projection (or dummy feature); with the term "dummy" being utilized to indicate that the projection has no electrical function. For instance, FIG. 5 shows construction 30 at a processing stage in which circuitry (not shown) associated with mesas 14 and 16 is electrically connected to other circuitry 40 and 42 of an integrated circuit, and in which projection 32 remains as a dummy feature disconnected from any other circuitry.

Figure 6:
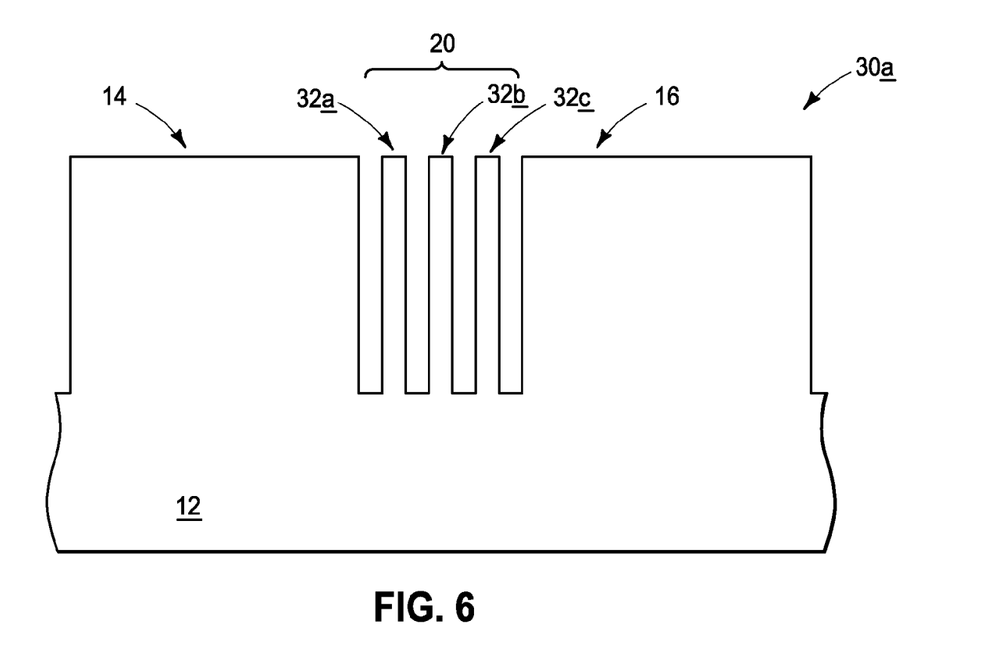
FIGS. 6 and 7 are diagrammatic cross-sectional views of a fragment of a semiconductor construction at process stages of another example embodiment.

As discussed above with reference to FIG. 3, in some embodiments multiple projections may be formed within intervening region 20. FIG. 6 shows an example embodiment construction 30a having three projections 32a-32c formed within an intervening region 20.

Figure 7:
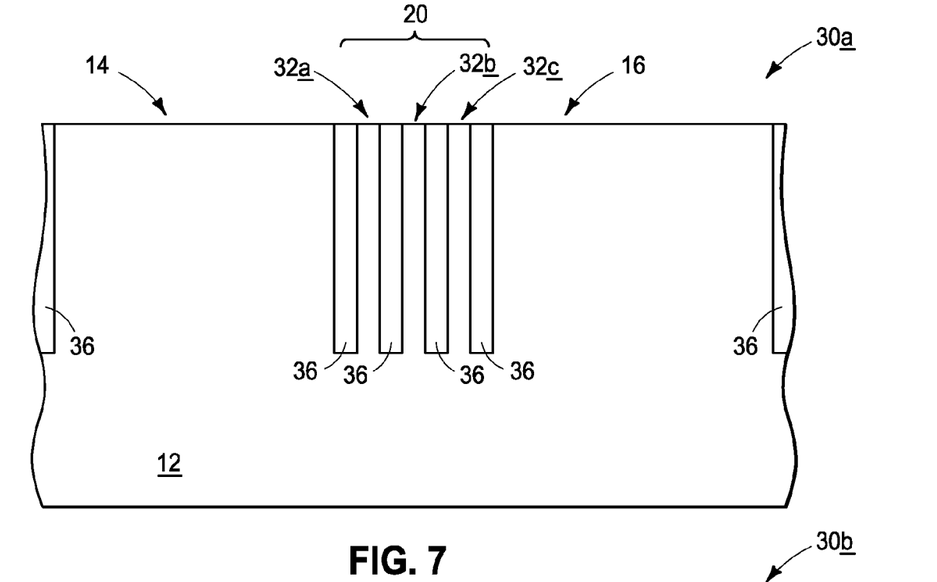

FIG. 7 shows construction 30a at a processing stage subsequent to that of FIG. 6 and analogous to that of FIG. 4, and shows intervening material 36 provided within gaps between the projections 32a-32c. The projections 32a-32c may be all be of similar size relative to one another, as shown. In some embodiments, all of the projections may have widths "X" described above relative to FIG. 3. In other embodiments, some of the projections within the intervening region 20 may be of different widths relative to others of the projections. The number of projections formed within intervening region 20, and the relative sizes of such projections, may be chosen to reduce stresses associated with intervening material 36 to acceptable levels which alleviate or prevent formation of the problematic defects described above in the "Background" section of this disclosure.

If multiple projections are formed within intervening region 20, all of the projections may be dummy projections in some embodiments; in other embodiments only some of the projections may be dummy projections; and in yet other embodiments all of the projections may be non-dummy projections. In the shown embodiment, the projections are a same height as the mesas. In other embodiments, some or all of the projections may extend to above the mesas; and/or some or all of the projections may have heights less than the heights of the mesas. Also, although the shown mesas are a same height as one another, in other embodiments the mesas may be of different heights relative to one another.

Figure 8:
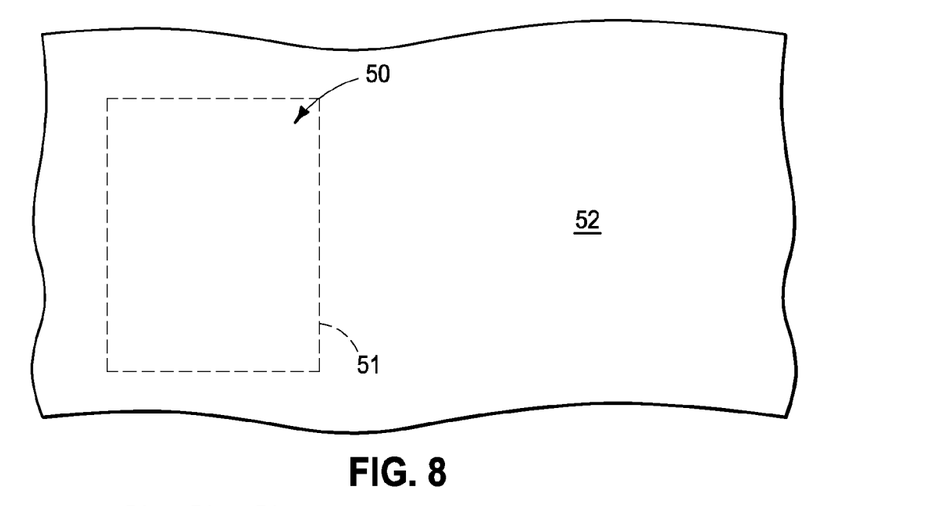
FIG. 8 is a top view of a fragment of a semiconductor construction in accordance with an example embodiment.
Figure 9:
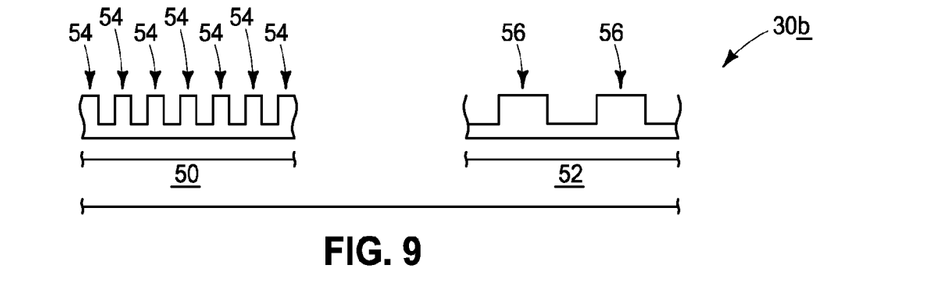
FIG. 9 is a diagrammatic cross-sectional view illustrating example embodiment regions of the FIG. 8 construction.

In some embodiments, it may be advantageous to utilize the projections described above in specific regions of a semiconductor construction; such as, for example, regions peripheral relative to memory array regions. FIG. 8 shows a top view of a semiconductor construction 30b having a memory array region 50 and a peripheral region 52 adjacent to the memory array region. The regions 50 and 52 may be comprised by a semiconductor base, and in some embodiments may be supported by a monocrystalline silicon substrate. A dashed line 51 is provided to diagrammatically illustrate a boundary between the memory array region and the peripheral region. The memory array region may have repeating units of highly integrated features (for instance, features associated with NAND, RRAM, DRAM, etc.), and the peripheral region may have less highly integrated features (for instance, wiring and/or logic utilized for data communication with memory cells of the memory array). FIG. 9 shows a diagrammatic cross-sectional view of the memory array region 50 and the peripheral region 52 to illustrate examples of highly integrated features 54 within the memory array region, and less highly integrated features 56 within the peripheral region. The highly integrated features 54 may be formed at a pitch approximate to 2F (where "F" is the minimum feature size of a photolithographic process utilized to form features 54), or may be formed to a sub-lithographic pitch achieved through pitch-multiplication or other methodologies. In contrast, features 56 of the peripheral region are formed to a much larger pitch than the features 54 of the memory array region.

The features 56 of the peripheral region have the configuration of mesas spaced from one another by a gap analogous to the configuration of FIG. 3, and may be suitable for application of the structures and methods described herein for reduction of defects in such mesas. Accordingly, in some embodiments methodologies and structures described herein are specifically utilized in the peripheral region of a semiconductor construction, as opposed to the memory array region of such construction.

Figure 10:
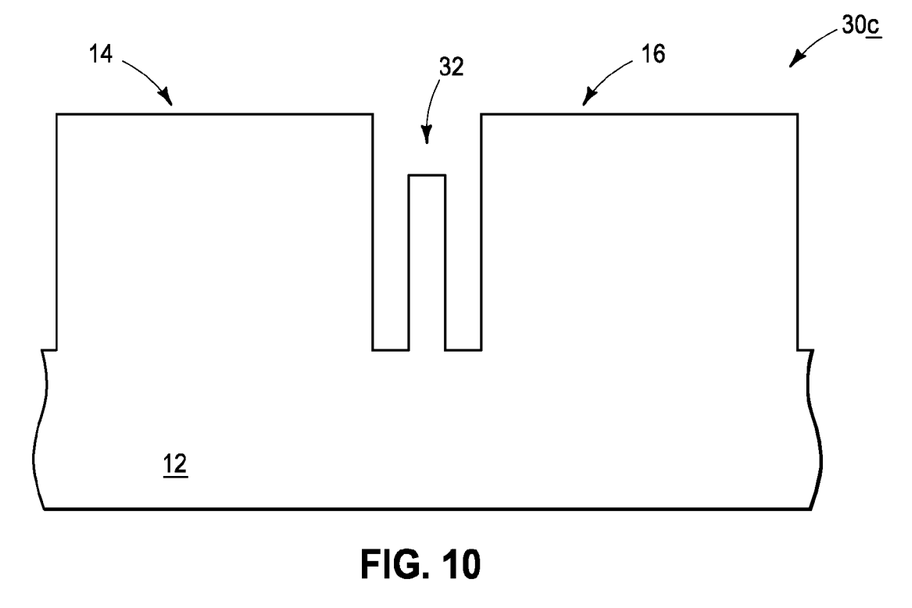
FIG. 10 is a diagrammatic cross-sectional view of a fragment of a semiconductor construction at a process stage of another example embodiment.
Figure 11:
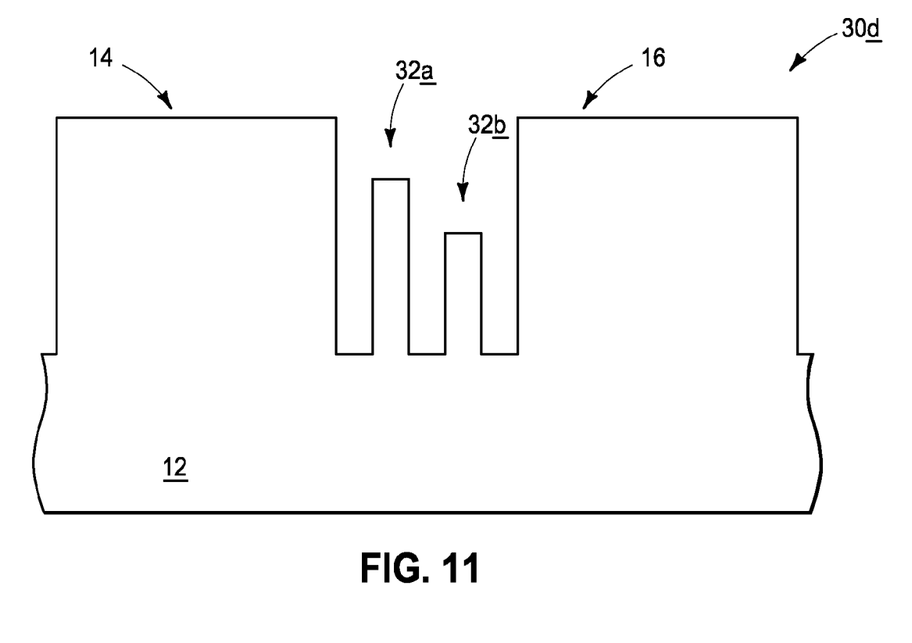
FIG. 11 is a diagrammatic cross-sectional view of a fragment of a semiconductor construction at a process stage of another example embodiment.

The projections described above with reference to FIGS. 3-7 may be formed to any suitable heights relative to the heights of the mesas. The embodiment of FIGS. 3-7 show the projections formed to about the same height as the mesas, but in other embodiments the projections may have different heights relative to the mesas. For instance, FIG. 10 shows a semiconductor construction 30c at a processing stage analogous to that of FIG. 3, but in which projection 32 shorter than the mesas. As another example, FIG. 11 shows a construction 30d comprising two projections 32a and 32b which are both shorter than the mesas 14 and 16, and which are of different heights relative to one another.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

Some embodiments include semiconductor constructions comprising semiconductor material patterned into two mesas spaced from one another by at least one dummy projection. The dummy projection has a width along a cross-section of X and the mesas have widths along the cross-section of at least about 3X.

Some embodiments include semiconductor constructions comprising a semiconductor base which includes a memory array region and a peripheral region adjacent the memory array region. Semiconductor material of the semiconductor base within the peripheral region is patterned into two relatively wide mesas spaced from one another by at least one relatively narrow projection. The relatively narrow projection has a width along a cross-section of X and the relatively wide mesas have widths along the cross-section of at least about 3X.

Some embodiments include semiconductor constructions comprising a silicon-containing base which includes a memory array region and a peripheral region adjacent the memory array region. Silicon of the base within the peripheral region is patterned into two relatively wide mesas spaced from one another by an intervening region comprising a relatively narrow projection and dielectric material. The dielectric material is between the relatively narrow projection and the relatively wide mesas. The relatively narrow projection has a width along a cross-section of X, and the relatively wide mesas have widths along the cross-section of at least about 3X. The dielectric material is configured as structures along the cross-section having widths of at least about X.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A completed semiconductor construction, comprising:
a semiconductor base comprising a memory array region and a peripheral region adjacent the memory array region;
semiconductor material of the semiconductor base within the peripheral region being patterned into two relatively wide mesas spaced from one another by an intervening region comprising at least one relatively narrow dummy feature projection having opposing sidewalls within the intervening region and having no electrical function, each of the two relatively wide mesas having a sidewall within the intervening region; the relatively narrow dummy feature projection having a width along a cross-section of X and the relatively wide mesas having widths along the cross-section of at least about 3X; at least some of the semiconductor material within the mesas being conductively-doped; and
intervening material within the intervening region, the intervening material being in direct physical contact with both of the mesa sidewalls and all the dummy feature projection sidewalls within the intervening region.

2. The semiconductor construction of claim 1 wherein the relatively wide mesas have widths along the cross-section of at least about 5X.

3. The semiconductor construction of claim 1 wherein the relatively wide mesas have widths along the cross-section of at least about 10X.

4. The semiconductor construction of claim 1 wherein the relatively wide mesas have widths along the cross-section of at least about 100X.

5. The semiconductor construction wherein the relatively wide mesas have widths along the cross-section of at least about 1000X.

6. The semiconductor construction of claim 1 wherein the intervening material is dielectric material.

7. The semiconductor construction of claim 6 wherein the dielectric material is silicon dioxide.

8. The semiconductor construction of claim 1 comprising only one dummy projection between the mesas.

9. The semiconductor construction of claim comprising more than one dummy projection between the mesas.

10. A completed semiconductor construction, comprising:
a silicon-containing base comprising a memory array region and a peripheral region adjacent the memory array region; and
silicon of the base within the peripheral region being patterned into two relatively wide mesas spaced from one another by an intervening region and a relatively narrow dummy projection within the intervening region having no electrical function, the intervening region comprising a dielectric material, with the dielectric material being between and contacting sidewalls of the relatively narrow dummy projection and sidewalls of the relatively wide mesas; the relatively narrow dummy projection having a width along a cross-section of X, and the relatively wide mesas having widths along the cross-section of at least about 3X; the dielectric material being configured as structures along the cross-section having widths of at least about X; at least some of the silicon within the mesas being conductively-doped.

11. The semiconductor construction of claim 10 wherein the relatively narrow dummy projection is one of a plurality of relatively narrow projections within the intervening region, the dielectric material being present between and contacting all of the dummy projections.

12. The semiconductor construction of claim 10 wherein the mesas and dummy projection all have about the same height as one another along the cross-section.

13. The semiconductor construction of claim 10 wherein the dummy projection is a different height than the mesas along the cross-section.

14. The semiconductor construction of claim 10 wherein the dummy projection is shorter than the mesas along the cross-section.

15. The semiconductor construction of claim 10 wherein the dielectric material comprises silicon dioxide.

16. The semiconductor construction of claim 10 wherein the relatively wide mesas have widths along the cross-section of at least about 5X.

17. The semiconductor construction of claim 10 wherein the relatively wide mesas have widths along the cross-section of at least about 100X.

18. The semiconductor construction of claim 10 wherein the relatively wide mesas have widths along the cross-section of at least about 1000X.

19. A completed semiconductor construction comprising a semiconductor material patterned into two conductively doped mesas spaced from one another by an intervening region consisting of two or more gaps filled with silicon dioxide and at least one dummy projection having no electrical function, the silicon dioxide being in contact with sidewalls of the dummy projection and sidewalls of the conductively doped mesas; the dummy projection having a first width along a cross-section and the mesas having second widths along the cross-section, the second width being greater than the first width.

* * * * *

UNITED STATES PATENT AND TRADEMARK OFFICE
CERTIFICATE OF CORRECTION

PATENT NO.           : 9,679,964 B2
APPLICATION NO.      : 14/853793
DATED                : June 13, 2017
INVENTOR(S)          : Chris Larsen et al.

It is certified that error appears in the above-identified patent and that said Letters Patent is hereby corrected as shown below:

In the Claims

Column 7, Line 46, Claim 5 – Replace "construction of claim wherein" with --construction of claim 1 wherein--

Column 7, Line 55, Claim 9 – Replace "construction of claim comprising" with --construction of claim 1 comprising--

Signed and Sealed this
Eighth Day of August, 2017

Joseph Matal
*Performing the Functions and Duties of the*
*Under Secretary of Commerce for Intellectual Property and*
*Director of the United States Patent and Trademark Office*